(12) United States Patent
Razavi et al.

(10) Patent No.: US 6,947,720 B2
(45) Date of Patent: Sep. 20, 2005

(54) LOW NOISE MIXER CIRCUIT WITH IMPROVED GAIN

(75) Inventors: Behzad Razavi, Los Angeles, CA (US); Pengfei Zhang, Fremont, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 659 days.

(21) Appl. No.: 09/847,866

(22) Filed: May 2, 2001

(65) Prior Publication Data
US 2002/0111152 A1 Aug. 15, 2002

Related U.S. Application Data

(63) Continuation-in-part of application No. 09/691,297, filed on Oct. 17, 2000.

(51) Int. Cl.[7] .................................................. H04B 1/28
(52) U.S. Cl. .................. 455/333; 455/326; 455/66.1; 455/296; 455/323; 455/330; 455/341; 455/343.1; 455/355; 330/51; 330/253; 330/254
(58) Field of Search ................................ 455/333, 326, 455/66.1, 296, 323, 330, 341, 343.1, 355; 330/51, 953; 333/254

(56) References Cited

U.S. PATENT DOCUMENTS

| 4,480,337 A | * | 10/1984 | Graziadei et al. ............ 455/333 |
| 6,057,714 A | * | 5/2000 | Andrys et al. ............... 327/105 |
| 6,175,274 B1 | * | 1/2001 | Groe ............................ 330/51 |
| 6,738,601 B1 | * | 5/2004 | Rofougaran et al. ........ 455/66.1 |

* cited by examiner

Primary Examiner—Jean Gelin
Assistant Examiner—David Q Nguyen
(74) Attorney, Agent, or Firm—Withrow & Terranova, PLLC

(57) ABSTRACT

A mixer circuit of the present invention includes a gain stage configured to receive a first signal and a modulated bias current, and in accordance therewith, produce an output signal, the gain stage generating a first current and receiving the modulated bias current from a bias circuit on a common node. The bias circuit includes an input configured to receive a second signal, and in accordance therewith, generate the modulated bias current. The mixer circuit also includes a current shunt circuit for generating a second current. The first current, the second current, and the modulated bias current are coupled to the common node. In one embodiment, the first signal is approximately a square wave, and the frequency of the first signal is one-third the frequency of the second signal.

24 Claims, 10 Drawing Sheets

US 6,947,720 B2

1

LOW NOISE MIXER CIRCUIT WITH IMPROVED GAIN

CROSS-REFERENCE TO RELATED APPLICATION

The present application claims priority from U.S. Non-Provisional patent application Ser. No. 09/691,297, filed Oct. 17, 2000, entitled "MIXER NOISE REDUCTION TECHNIQUE," the entire disclosure of which is incorporated herein by reference.

BACKGROUND OF THE INVENTION

The present invention relates to mixer circuits and, more particularly, to a mixer circuit with low noise and improved gain.

Mixer circuits, also known as modulator circuits, find many applications in electronic systems. For example, mixer circuits are widely used in wireless communication devices such as pagers and cellular phones to receive or transmit a modulated Radio Frequency (RF) signal. The function of a mixer circuit is to combine signals of two different frequencies in such a way as to produce energy at other frequencies. This function is typically achieved by designing a circuit that receives two input signals and produces an output that is product of the two inputs. The product of two periodic input signals will result in a modulated output signal as is well known in the art.

FIG. 1 illustrates a contemporary mixer circuit 100 for combining an RF signal and a differential input signal. The mixer circuit 100 of FIG. 1 includes a gain stage 110 and a bias circuit 120. The gain stage 110 of mixer circuit 100 receives a differential input signal ($V_{in1}$–$V_{in2}$) and produces a differential output signal $V_O$. The gain stage 110 includes a pair of NMOS transistors 101 and 102 with their sources coupled together at common node 105. The gain stage 110 also includes a pair of load resistors 103 and 104 connected between the drains of transistors 101 and 102 and a supply voltage $V_{dd}$ respectively. Bias circuit 120 of mixer circuit 100 includes an NMOS transistor 121 having an input to receive a bias voltage $V_{bias}$ to produce a bias current $I_{bias}$. Bias current $I_{bias}$ is coupled to the common node 105 to set the bias currents in transistors 101 and 102.

Mixer circuit 100 of FIG. 1 produces a modulated output by including an RF signal input to bias circuit 120. Bias circuit 120 receives an RF signal $V_{RF}$ at the drain of transistor 121. This signal has the effect of modulating the bias current $I_{bias}$. As $I_{bias}$ is modulated, the bias currents in transistors 101 and 102 are modulated, thereby varying the gain of gain stage 110 by an amount proportional to the amplitude of the RF signal. Accordingly, the output of mixer circuit 100 is the product of the differential input voltage ($V_{in1}$–$V_{in2}$) and the RF signal $V_{RF}$.

However, contemporary mixer circuits such as the one illustrated in FIG. 1 are often required to perform signal processing in environments that are very sensitive to the introduction of noise. For example, in a receiver the input signal may be very small (e.g. 10 microvolts). Accordingly, the receiver signal path requires high sensitivity, which in turn demands low noise. Therefore, a mixer circuit in the receiver signal path must minimize the amount of noise

2 introduced into the system. Additionally, transmitted signals may be distorted by noise in the transmission signal path, and therefore can be more difficult to receive at the other end of the transmission medium. Likewise, signals input to a receiver may already be heavily distorted, and the introduction of additional noise may reduce the fidelity of the information contained in the signal. Moreover, the differential input signal ($V_{in1}$–$Vin_2$) in many systems is generated on the same integrated circuit as the mixer circuit. Additional problems arise when the differential signal feeds into the RF signal path and is gained up with the RF signal in a preamplifier. Such feed-through distortion may lead to undesirable DC offsets.

Accordingly, a mixer circuit that reduces the amount of noise introduced into the signal path during either the reception or transmission of a signal is desired.

SUMMARY OF THE INVENTION

A mixer, in accordance with one embodiment of the present invention, includes a gain stage coupled to receive a first signal and a modulated bias current, and in accordance therewith, produce an output signal, the gain stage being configured to generate a first current and to receive the modulated bias current on a common node, a current shunt circuit coupled between the common node and a reference voltage, the current shunt circuit being configured to generate a second current, wherein the first current and the second current are coupled to the common node, and a bias circuit to generate the modulated bias current, the bias circuit having an input configured to receive a second signal, and in accordance therewith, generate the modulated bias current, and an output coupled to the common node to provide the modulated bias current to the gain stage.

According to one embodiment, the current shunt circuit comprises a MOS transistor coupled between the common node and a supply voltage.

According to one embodiment, the second signal is an RF signal and the first signal is a differential signal, and the frequency of the differential signal is an integer fraction of the frequency of the RF signal, for example one-third.

According to one embodiment, the bias circuit comprises a transistor having a control input and a first and second output, wherein the control input is coupled to a bias voltage, the first output is coupled to a second reference voltage, and the second output is coupled to the common node.

According to one embodiment, the differential stage comprises a first transistor having a control input and first and second outputs. The control input of the first transistor is coupled to receive a first component of the differential signal. The differential stage also comprises a second transistor having a control input and first and second outputs, the control input coupled to receive a second component of the differential signal. Further, the differential stage comprises a load coupled to the first output of the first transistor and to the first output of the second transistor, wherein the second output of the first transistor and the second output of the second transistor are coupled together and to the common node.

According to one embodiment, the present invention includes a method of mixing signals in a mixer circuit. The method comprises generating a first current in a differential stage, generating a second current in a shunt circuit, coupling the first current and the second current through a common node to generate a bias current in a bias circuit, receiving an RF signal in the bias circuit, receiving a second signal in the differential stage, and generating a mixer output in accordance with the RF signal and the second signal.

The following detailed description and the accompanying drawings provide a better understanding of the nature and advantages of the present invention.

DESCRIPTION OF THE SPECIFIC EMBODIMENTS

Figure 1:
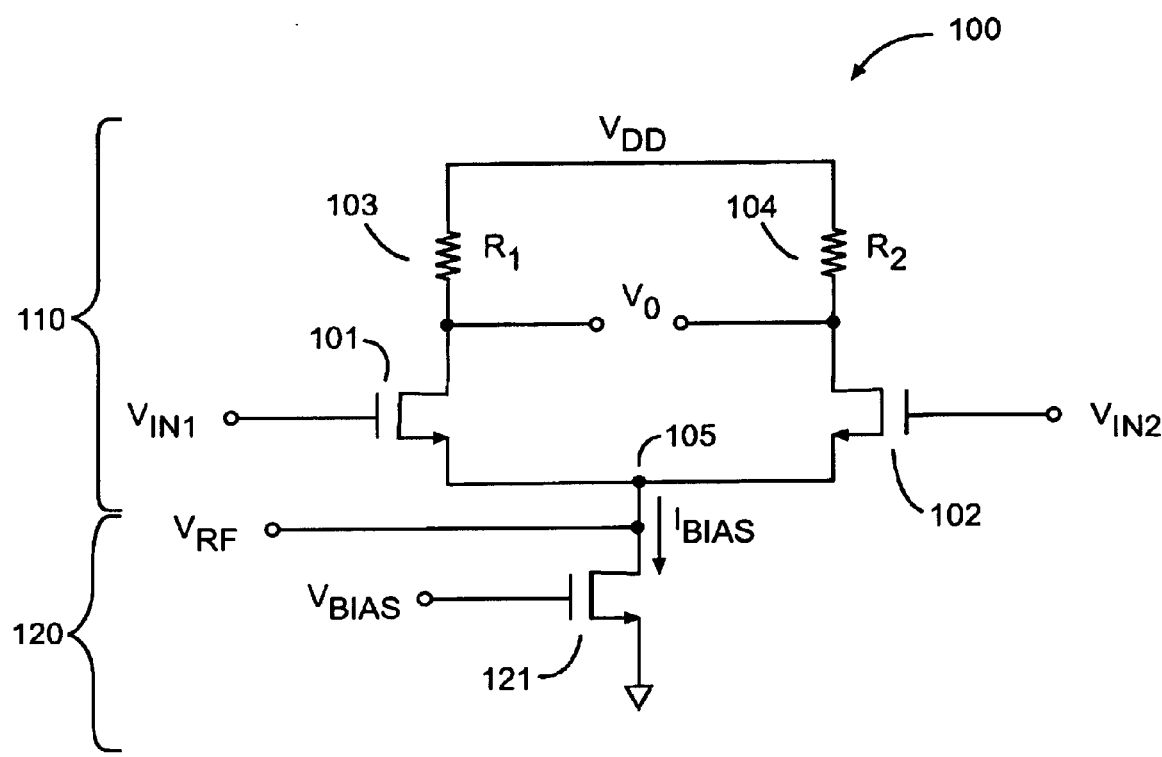
FIG. 1 illustrates one example of a mixer circuit for combining an RF signal and a differential input signal.
Figure 2:
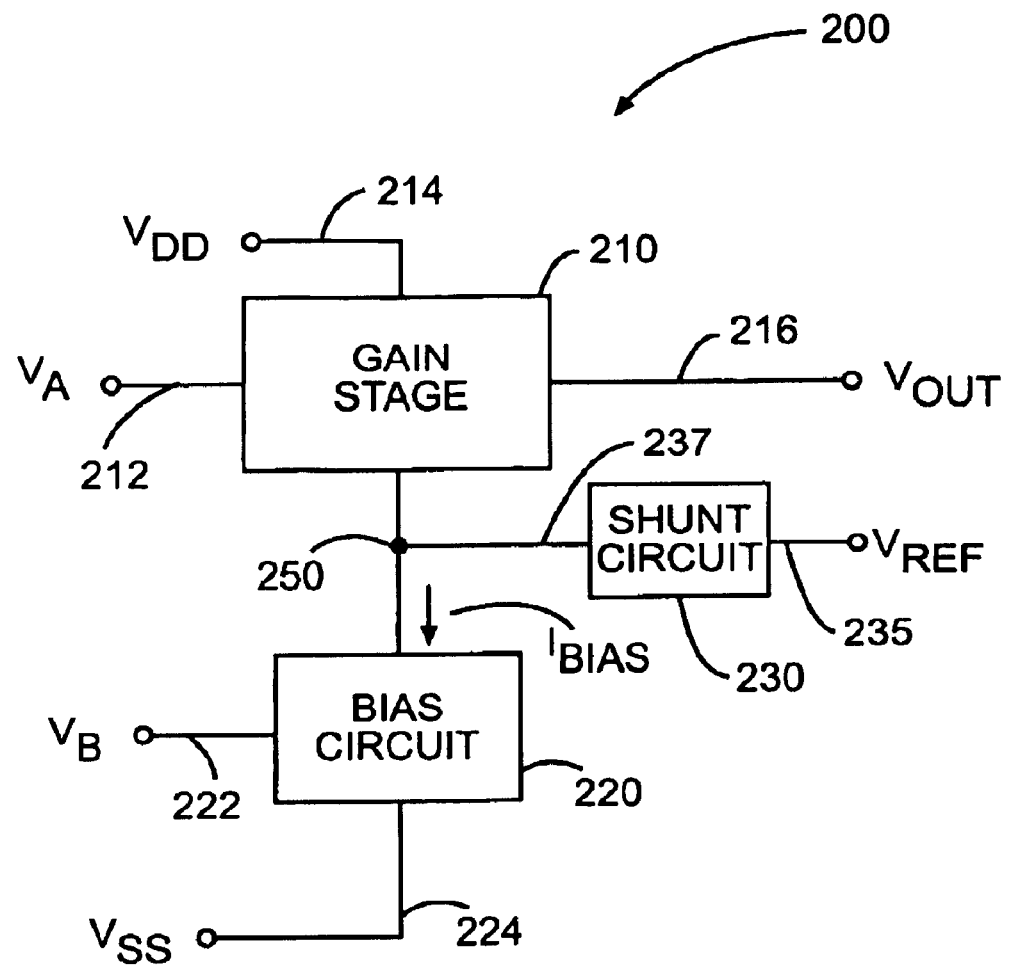
FIG. 2 illustrates a low noise mixer circuit with enhanced gain according to one embodiment of the present invention.

FIG. 2 illustrates a low noise mixer circuit 200 with enhanced gain according to one embodiment of the present invention. Mixer circuit 200 of FIG. 2 includes a gain stage 210, a bias circuit 220 and a shunt circuit 230. Gain stage 210 receives an input signal $V_A$ on input node 212 and produces an output signal $V_{out}$ on output node 216. Additionally, gain stage 210 is powered by supply voltage $V_{dd}$ received on supply terminal 214, which generates internal gain stage bias currents (not shown). The bias currents are used to set the gain of the internal devices of the gain stage and may, in turn, be coupled to common node 250.

Bias circuit 220 is coupled to common node 250 and to a second supply voltage $V_{SS}$. Bias circuit 220 also receives an input signal $V_B$ on input line 222 to produce a bias current $I_{bias}$. Bias current $I_{bias}$ is then coupled to common node 250 which is coupled to gain stage 210. Input signal $V_B$ may include both AC and DC frequency components. For example, the input signal to bias circuit 220 may include a DC bias voltage to generate a DC bias current component of $I_{bias}$, and a AC input signal to generate a primary AC bias current frequency component to be mixed with gain stage input signal $V_A$. In accordance with such components, bias circuit 220 will generate a bias current $I_{bias}$ with both AC and DC bias current frequency components. Therefore, it is to be understood that input signal $V_B$ is illustrative of one or more inputs to bias circuit 220. In one embodiment, input signal $V_B$ is a composite signal having both AC and DC components. In another embodiment, input signal $V_B$ comprises a first DC bias input signal line received by the bias circuit 220 for generating a DC bias current, and a second separate AC input signal line received by the bias circuit 220 for introducing AC bias current frequency components into the DC bias current.

Shunt circuit 230 of FIG. 2 is coupled between the common node 250 and a reference voltage $V_{REF}$ 235. Shunt circuit 230 generates a shunt current on line 237 which is coupled to common node 250. The shunt current from shunt circuit 230 is combined with bias currents in the gain stage 210 and with the bias current $I_{bias}$ to control the biasing of the gain stage 210 and bias circuit 220. In one embodiment, shunt circuit 230 is coupled between the common node 250 and the supply voltage. Moreover, in one embodiment, shunt circuit 230 is a passive circuit. In another embodiment, shunt circuit 230 is an active circuit.

In one embodiment, the shunt circuit 230 of FIG. 2 is a frequency dependent current shunt circuit. Frequency dependent current shunt circuit 230 will shunt a portion of the bias current $I_{bias}$ from bias circuit 220 to the reference voltage $V_{REF}$ depending on the frequency of the AC bias current frequency components. In one embodiment, the shunt circuit will couple a first portion of the bias current frequency components within a first frequency range to the reference voltage, and a second portion of the bias current frequency components within a second frequency range to the reference voltage. For example, across a range of lower frequencies, such as DC up to some frequency below the RF input signal frequency, a greater portion of the bias current is shunted to $V_{REF}$ than at high frequencies. On the other hand, across a range of high frequencies, such as some frequency sufficiently below the RF input signal frequency up to some frequency above the RF input frequency, only a small portion of the bias current (e.g. substantially zero) is shunted to the supply. Shunt circuit 230 may also be conceptualized as a frequency dependent impedance $Z(\omega)$. When the AC bias current frequency components are within a first low frequency range, the impedance of the shunt circuit is low, and a larger portion of the bias current is coupled to $V_{REF}$ than when the AC bias current frequency components of the bias current are within a second high frequency range, where the impedance of the shunt circuit $Z(\omega)$ is higher.

In accordance with the frequency dependent shunting of the bias current $I_{bias}$ from common node 250, there will be less bias current flowing through gain stage 210 at lower frequencies and more bias current flowing through gain stage 210 at higher frequencies. As a result, the noise introduced into the output signal $V_{out}$ by mixer circuit 200 is greatly reduced. Noise in the mixer circuit 200 is reduced because the noise in an integrated circuit device, such as a transistor, will increase as the operating currents of the device increase. Additionally, the noise in an integrated circuit device will decrease as the operating currents decrease. Therefore, the noise introduced into the output signal $V_{out}$ by the gain stage 210 is reduced because at low frequencies, the devices in gain stage 210 are operating at lower operating currents, and therefore, generating less noise. Moreover, in some embodiments, reducing the DC operating current allows for improving the gain of the gain stage by allowing for larger voltage swings at the output. Therefore, by reducing the current in the gain stage at low frequencies, the shunt circuit $Z(\omega)$ also has the additional effect of improving the amount of gain in the gain stage. As a result, the mixer circuit provides an output with improved gain, but the noise introduced by noise components in bands below the AC bias frequency can be reduced.

The mixer circuit 200 illustrated by FIG. 2 shows that gain stage 200 is coupled to a first reference voltage (i.e. supply voltage Vdd) and bias circuit 220 is coupled to a second reference voltage (i.e. supply voltage Vss), such that Vdd>Vss. It is to be understood that Vss is a supply voltage below Vdd and may be at ground potential or some other positive or negative voltage. However, it should also be understood that other configurations for mixer circuit could also be used. For example, in embodiments using opposite polarity device types, gain stage 210 could be coupled to the more negative reference voltage and bias circuit 220 to the more positive reference voltage. Additionally, in other embodiments the more negative reference voltage could be ground. Likewise, in other embodiments the more positive reference voltage could be ground.

Figure 3:
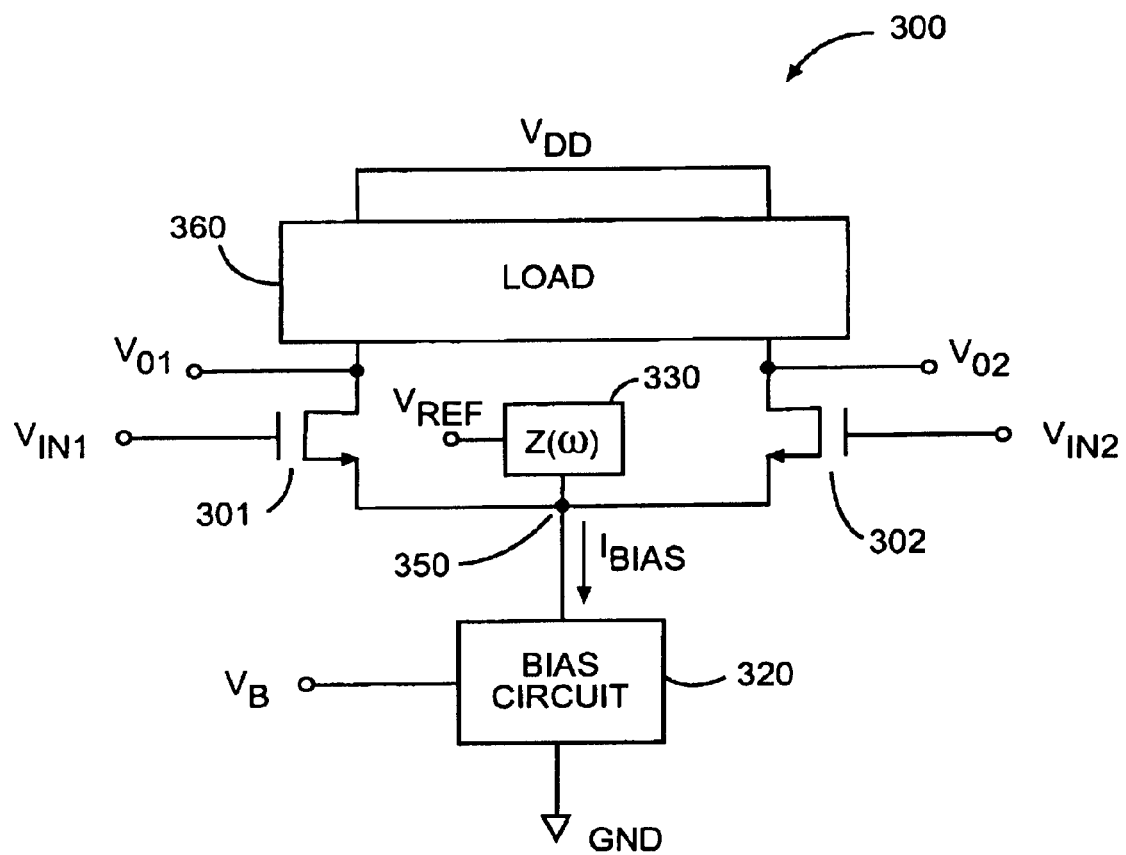
FIG. 3 illustrates a mixer circuit with a differential gain stage according to one embodiment of the present invention.

FIG. 3 illustrates a mixer circuit 300 with a differential gain stage according to one embodiment of the present invention. The differential gain stage of mixer circuit 300 includes a pair of input NMOS transistors 301 and 302 and a load 360. It is to be understood that in other embodiments, other transistors such as PMOS, NPN, PNP, or GaAs could also be used. The NMOS transistors 301 and 302 each have their gates coupled to receive an input signal, which in this case is a differential input signal comprised of $V_{in1}$ and $V_{in2}$. Additionally, the sources of transistors 301 and 302 a re coupled together and to the common node 350. The drains of the transistors are connected to a load 360. The load 360 may be an active or passive load with a differential output, as shown, or a single ended output.

Bias circuit 320 is coupled between common node 350 and ground node ("GND") 324, and receives an input signal $V_B$ to generate a bias current $I_{bias}$. Input signal $V_B$ will typically include both AC and DC components, as mentioned previously. Bias current $I_{bias}$ is coupled to common node 350, and in accordance therewith, sets the amount of current in transistors 301 and 302. More particularly, when $V_{in1}=V_{in2}$, the current in transistors 301 and 302 is approximately equal.

Frequency dependent current shunt circuit $Z(\omega)$ 330 is coupled between common node 350 and a reference voltage $V_{REF}$. At low frequencies, shunt circuit 330 will shunt a greater portion of the bias current to $V_{REF}$ and away from transistors 301 and 302. However, at high frequencies, shunt circuit will shunt a lower portion of the bias current to $V_{REF}$.

Therefore, more bias current will be provided to transistors 301 and 302 at the frequencies of interest, namely the frequency of the AC component of the bias circuit. This allows designers the ability to design a differential gain stage to run at higher bias currents and achieve greater gains without the noise penalty typically associated with high bias currents and large gains.

Figure 4:
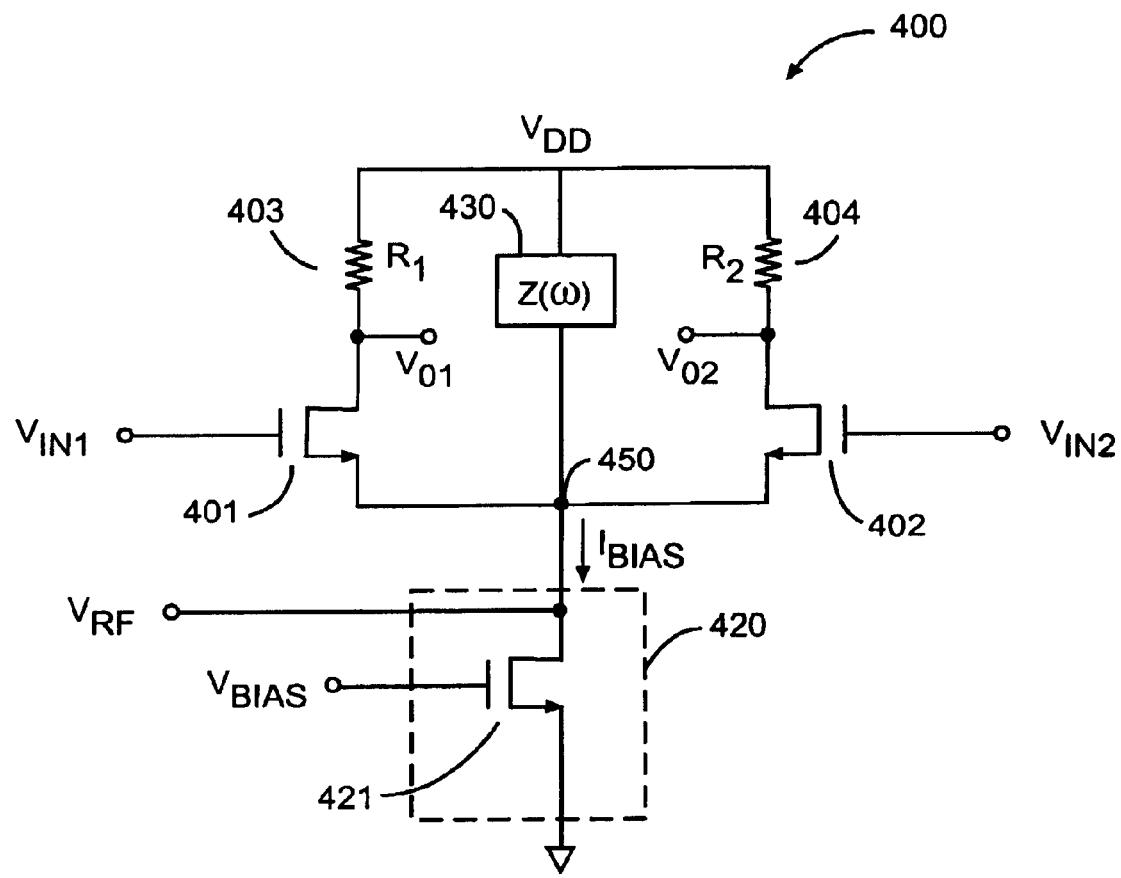
FIG. 4 illustrates another mixer circuit with a passive load in the gain stage and a transistor bias circuit according to one embodiment of the present invention.

FIG. 4 illustrates another mixer circuit 400 with a passive load in the gain stage and a transistor bias circuit 420 according to another embodiment of the present invention. The mixer circuit 400 of FIG. 4 includes a differential gain stage comprised of a pair of NMOS transistors 401 and 402 and a passive load circuit comprised of resistors 403 and 404. The gates of NMOS transistors 401 and 402 receive a differential input ($V_{in1}-V_{in2}$), and the output ($V_{o1}-V_{o2}$) is taken across their drains. Gain is provided by the action of the transistor drain currents with resistors 403 and 404, which are coupled between the drains of transistors 401 and 402 and supply voltage $V_{dd}$, respectively.

Bias circuit 420 comprises a single NMOS transistor 421. The gate of transistor 421 is coupled to a bias voltage $V_{bias}$ to generate a DC component of bias current $I_{bias}$ (not shown). The source of transistor 421 is coupled to ground voltage and the drain is coupled to common node 450, The drain is also coupled to a high frequency input signal $V_{RF}$, which modulates the bias current $I_{bias}$.

Mixer circuit 400 of FIG. 4 also includes a frequency dependent current shunt circuit $Z(\omega)$ 430 coupled between common node 450 and a reference voltage $V_{REF}$. At low frequencies, shunt circuit 430 will shunt a greater portion of the bias current to $V_{REF}$ and away from transistors 401 and 402. However, at high frequencies, shunt circuit will shunt a lower portion of the bias current to $V_{REF}$. Therefore, shunt circuit 430 can be designed to shunt bias current away from transistors 401 and 402 at frequencies below the frequency of input signal $V_{RF}$, thereby reducing the noise introduced into the signal path. However, at the frequency of interest, shunt circuit 430 will reduce the portion of bias current coupled to $V_{REF}$, and thereby increase the gain of the gain stage. Accordingly, the total broadband noise in the signal path is reduced and the gain of the mixer circuit increased.

Figure 5:
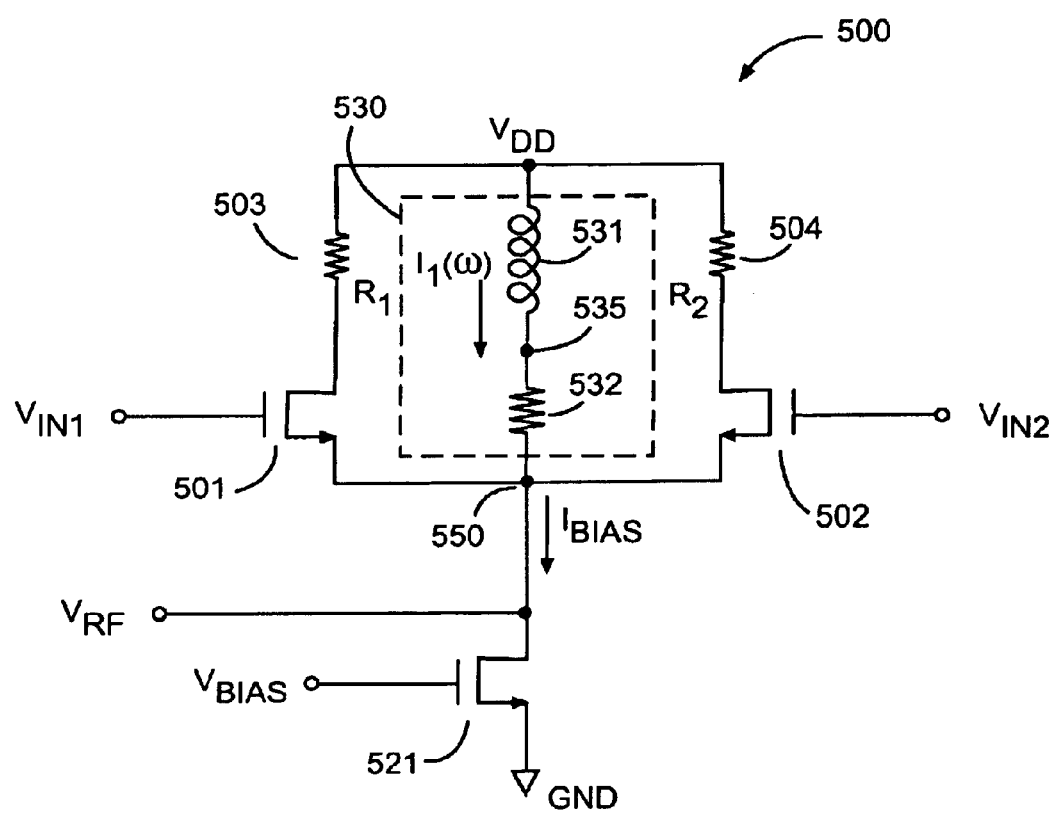
FIG. 5 illustrates another mixer circuit with a RL network according to one embodiment of the present invention.

FIG. 5 illustrates another mixer circuit 500 with a shunt circuit 530 including an RL network according to another embodiment of the present invention. Mixer circuit 500 includes a gain stage comprised of a pair of NMOS transistors 501 and 502 coupled to supply voltage $V_{dd}$ through a pair of load resistors 503 and 504, respectively. Mixer circuit 500 also includes a bias circuit comprised of NMOS transistor 521 having a gate coupled to a bias voltage $V_{bias}$, a source coupled to ground, and a drain coupled to common node 550 for coupling bias current Ibias to the gain stage. The drain of transistor 521 is also coupled to input signal $V_{RF}$ to modulate $I_{bias}$.

Frequency dependent current shunt circuit 530 is coupled between common node 550 and a supply voltage Vdd. The shunt circuit 530 of the present embodiment is comprised of an inductor 531 and a resistor 532 coupled in series between the supply Vdd and the common node 550. A first terminal of the inductor 531 is coupled to the supply Vdd and a second terminal of the inductor is coupled to the resistor 532 at node 535. The resistor 532, in turn, is coupled between node 535 and common node 550.

At low frequencies, shunt circuit 530 will shunt a greater portion of the bias current to $V_{dd}$ and away from transistors 501 and 502. However, at high frequencies, shunt circuit will shunt a lower portion of the bias current to $V_{dd}$. This is illustrated by observing that at low frequencies, the inductor 531 is a short circuit, thus, shunt current $I_1(\omega)$ will be generated according to the difference between $V_{dd}$ and the voltage on the common node 550. Therefore, by choosing an appropriate value for resistor 532, the portion of the bias current $I_{bias}$ shunted to $V_{dd}$ at low frequency can be set to give a desired gain. Moreover, at high frequencies, the impedance of inductor 531 is higher. Accordingly, the shunt current $I_1(\omega)$ will begin to decrease. The values of the inductor 531 and resistor 532 can be chosen such that at the frequency of interest (i.e. the frequency of $V_{RF}$), the shunt current will be approximately zero or otherwise sufficiently reduced such that the bias current in transistors 501 and 502 produces the desired gain. Choosing appropriate values for the inductor and resistor would depend on the particular design parameters of the mixer and would be known by one skilled in the art in light of the teachings of this disclosure.

Figure 6:
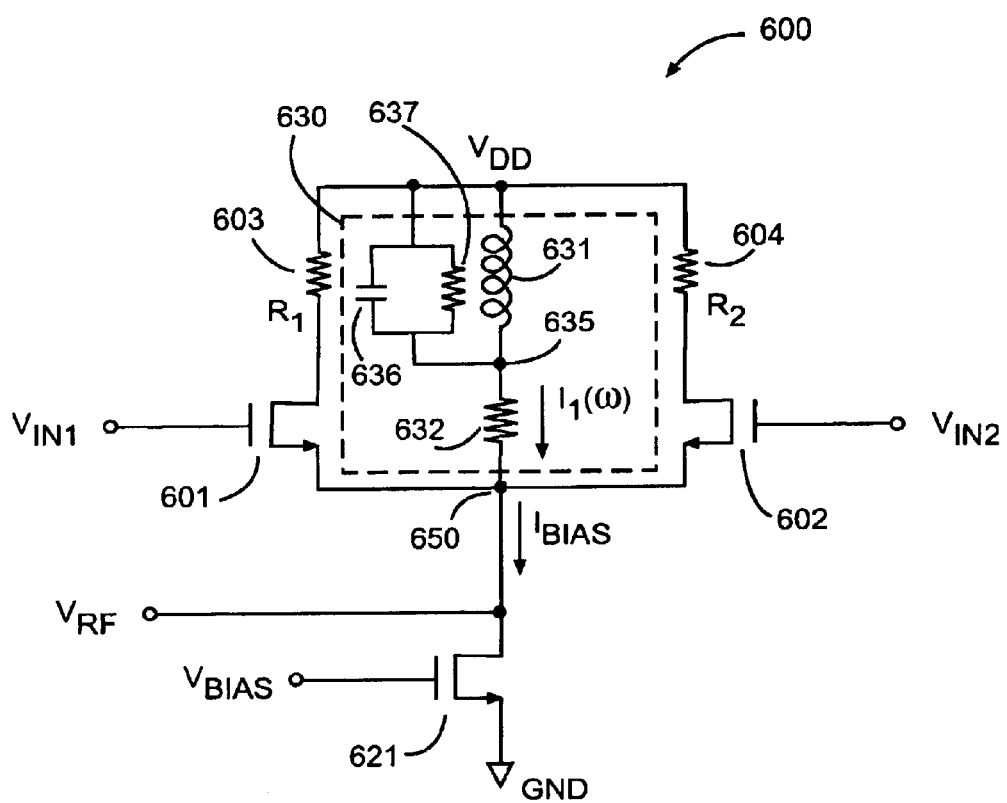
FIG. 6 illustrates another mixer circuit with an integrated inductor and parasitic elements according to one embodiment of the present invention.

FIG. 6 illustrates another mixer circuit 600 with an integrated inductor 631 and parasitic elements according to another embodiment of the present invention. Mixer circuit 600 includes a gain stage comprised of a pair of NMOS transistors 601 and 602 coupled to supply voltage $V_{dd}$ through a pair of load resistors 603 and 604, respectively. Mixer circuit 600 also includes a bias circuit comprised of NMOS transistor 621 having a gate coupled to a bias voltage $V_{bias}$, a source coupled to ground and a drain coupled to common node 650 for coupling bias current $I_{bias}$ to the gain stage. The drain of transistor 621 is also coupled to input signal $V_{RF}$ to modulate $I_{bias}$.

Mixer circuit 600 also includes a frequency dependent current shunt circuit 630 coupled between common node 650 and a supply voltage $V_{dd}$. The shunt circuit 630 is comprised of an integrated inductor 631 and an integrated resistor 632 coupled in series between the supply $V_{dd}$ and the common node 650. A first terminal of the inductor 631 is coupled to the supply $V_{dd}$ and a second terminal of the inductor is coupled to the resistor 632 at node 635. The resistor 632, in turn, is coupled between node 635 and common node 650. In one embodiment, the integrated inductor and resistor are fabricated on a substrate. The substrate may be a silicon substrate or other substrate useful for providing the inductor and/or resistor on a single integrated circuit or in a single integrated circuit package. The integrated inductor 631 of shunt circuit 630 includes parasitic elements. The parasitic elements include a parasitic capacitance 636 and a parasitic resistance 631 coupled in parallel with inductor 637 between supply voltage Vdd and node 635.

The existence of parasitic capacitance and inductance should preferably be taken into account in order to guarantee that the appropriate amount of current is shunted to Vdd at the appropriate frequencies. Accordingly, Table 1 below illustrates one example of values that could be used for the passive and active devices included in mixer circuit 600 according to one embodiment of the present invention. The values in Table 1 are intended to be illustrative and not limiting.

TABLE 1

| Device | Parameter | Value |
| --- | --- | --- |
| NMOS transistor 601 | N * W/L | 8 * 1.25 u/180 n |
| NMOS transistor 602 | N * W/L | 8 * 1.25 u/180 n |
| NMOS transistor 621 | N * W/L | 4 * 2 u/180 n |
| Resistor R1 603 | R | 2K |
| Resistor R2 604 | R | 2K |
| Resistor 632 | R | 1K |
| Inductor 631 | L | 14 nH |
| Parasitic Resistance 637 of Inductor 631 | R | 1.4K |
| Parasitic Capacitance 636 of Inductor 631 | C | 65 fF |

Figure 7:
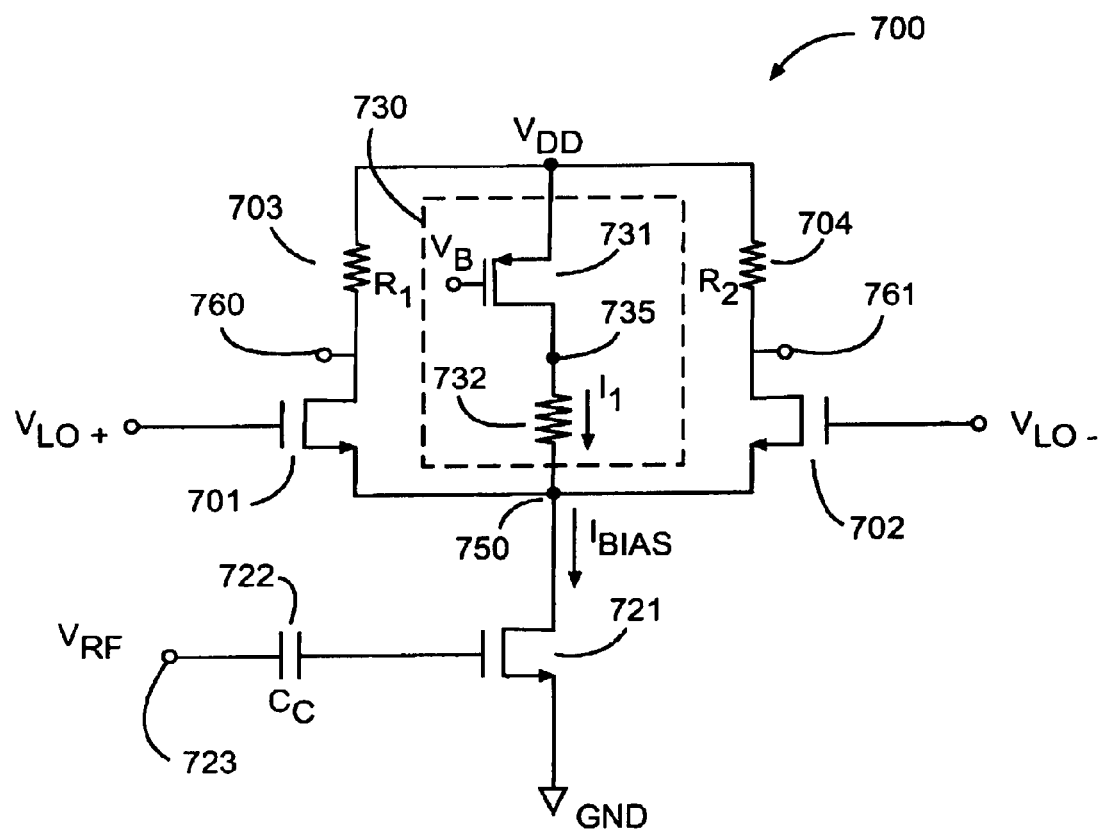
FIG. 7 illustrates another mixer circuit having a gain stage, a transistor bias circuit, and an active shunt circuit according to one embodiment of the present invention.

FIG. 7 illustrates another mixer circuit having a gain stage, a transistor bias circuit, and an active shunt circuit according to one embodiment of the present invention. Mixer circuit 700 includes a gain stage comprised of a pair of NMOS transistors 701 and 702 coupled to supply voltage $V_{dd}$ through a pair of load resistors 703 and 704, respectively. Mixer circuit 700 also includes a bias circuit comprised of NMOS transistor 721 having a gate coupled to a coupling capacitor 722. The capacitor 722 receives the RF input signal $V_{RF}$. The drain of transistor 721 is coupled to common node 750 for coupling bias current Ibias to the gain stage.

The embodiment of FIG. 7 includes an active current shunt circuit 730 coupled between common node 750 and a supply voltage Vdd to control the biasing of the gain stage and bias circuit. The shunt circuit 730 of the present embodiment is comprised of a transistor 731 and a resistor 732 coupled in series between the supply Vdd and the common node 750. A first terminal of the transistor 731 is coupled to the supply Vdd and a second terminal of the transistor is coupled to the resistor 732 at node 735. The resistor 732, in turn, is coupled between node 735 and common node 750.

Features and advantages of the embodiment shown in FIG. 7 can more readily be understood by noting that the gain of transistor 721 in saturation is given by the following equation:

$$g_m = \frac{\partial I_{bias}}{\partial V_{GS}} = \sqrt{2k'\frac{W}{L}I_{bias}}$$

Where k', W, and L are device parameters and $I_{bias}$ is the DC drain current. Accordingly, the gain of the mixer circuit 700 can be increased by increasing $I_{bias}$. This will allow the differential input stage to operate at lower DC currents, which will result in less noise and allow for larger output swings across resistors 703 and 704.

The present invention increases the gain of mixer circuit 700 by providing a shunt current $I_1$, generated by transistor 731, into the drain of bias transistor 721 through common node 750. Transistor 731 may generate the shunt current by receiving a gate bias voltage $V_b$. The gate bias voltage may be generated by configuring transistor 731 in a current mirror configuration with other transistors (not shown), for example. In one embodiment, shunt current $I_1$ is coupled to common node 750 through a resistor 732. However, in other embodiments resistor 732 may be eliminated.

The RF signal is received by mixer circuit 700 at node 723. The signal is AC coupled through coupling capacitor 722 and applied to the gate of transistor 721. The RF signal is amplified and generates a modulated bias current $I_{bias}$. The DC bias current component of $I_{bias}$ consists of current components through differential transistors 701 and 702, and shunt circuit 703. The differential input stage receives a differential signal ($V_{LO+}$–$V_{LO-}$). In one embodiment, the differential signal is generated by a local oscillator that is manufactured on the same integrated circuit as the mixer circuit. The output of the mixer circuit may be taken at nodes 760 and 761.

In one embodiment, mixer circuit 700 is used in a subsampling mode of operation. In subsampling mode, the frequency of differential input signal $V_{LO+}$ and $V_{LO-}$ is below the RF input frequency. For example, the frequency of the differential signal may be an integer fraction (i.e. 1/N) of the frequency of the RF signal. In one exemplary embodiment, the integer fraction is ⅓, and the frequency of the local oscillator runs at one-third the frequency of the RF input signal. Additionally, the differential input signal ($V_{LO+}$–$V_{LO-}$) can be applied to the gates of transistors 701 and 702 with large amplitudes (e.g., by gaining up the signals). For example, rather than applying the differential signal directly from a local oscillator circuit as a sine wave, the output of the local oscillator may be amplified to generate a differential signal with a large amplitude. By applying large amplitude differential input signal, the gates of transistors 701 and 702 may be driven across a wide input voltage range, and the differential input signal may approximate a square wave input having a fundamental frequency equal to the differential input signal frequency. The output of the mixer circuit in response to an approximate square wave differential input can be understood by noting that a square wave can be represented as a sum of periodic functions.

$$(V_{LO+}, V_{LO-})_{SQRW} = \sum_{n=1,3,5,...} \frac{K \sin n w_o I}{n} = K \sin w_o I + \frac{K \sin 3 w_o I}{3} + ...$$

Where ($V_{LO+}$,$V_{LO-}$)$_{SQRW}$ represents the approximation of a perfect square wave achieved by applying large amplitude differential input signals to the gates of transistors 701 and 702. Therefore, the series expansion of a square wave contains a frequency component at three times the frequency of the square wave (i.e. a third harmonic). Accordingly, if the mixer circuit receives a square wave input with a frequency of one-third the RF input frequency, the RF signal can be combined in the mixer with the third harmonic of the differential input signal to produce a mixer output.

It should be noted that the above described subsampling technique is facilitated by the improved gain of the mixer circuit of the present invention. The application of a square wave at the input of a typical mixer circuit would not result in an output that would be as useful because the third harmonic is at a much lower level than the fundamental of the input square wave. Accordingly, additional gain or reduced noise, or both, are required to effectively mix this harmonic with the input RF signal. The enhanced gain and reduced noise achieved by utilizing a shunt circuit and shunt current in accordance with the present invention allow a designer to utilize a subsampling technique. An additional advantage of the subsampling technique facilitated by the present invention is that the system may use a lower frequency local oscillator, which is both easier to design and lower in cost. Table 2 illustrates exemplary values for a mixer circuit 700 operable in a subsampling mode.

TABLE 2

| Device | Parameter | Value |
| --- | --- | --- |
| NMOS transistor 701 | W/L | 50/0.18 |
| NMOS transistor 702 | W/L | 50/0.18 |
| NMOS transistor 721 | W/L | 10/0.18 |
| NMOS transistor 731 | W/L | 5/0.5 |
| Resistor R1 703 | R | 6K |
| Resistor R2 704 | R | 6K |
| Resistor 732 | R | 2K |
| Differential Input Frequency | $f_{LO}$ | 1.7 GHz |
| RF Input Frequency | $f_{RF}$ | 5.1 GHz |

Figure 8:
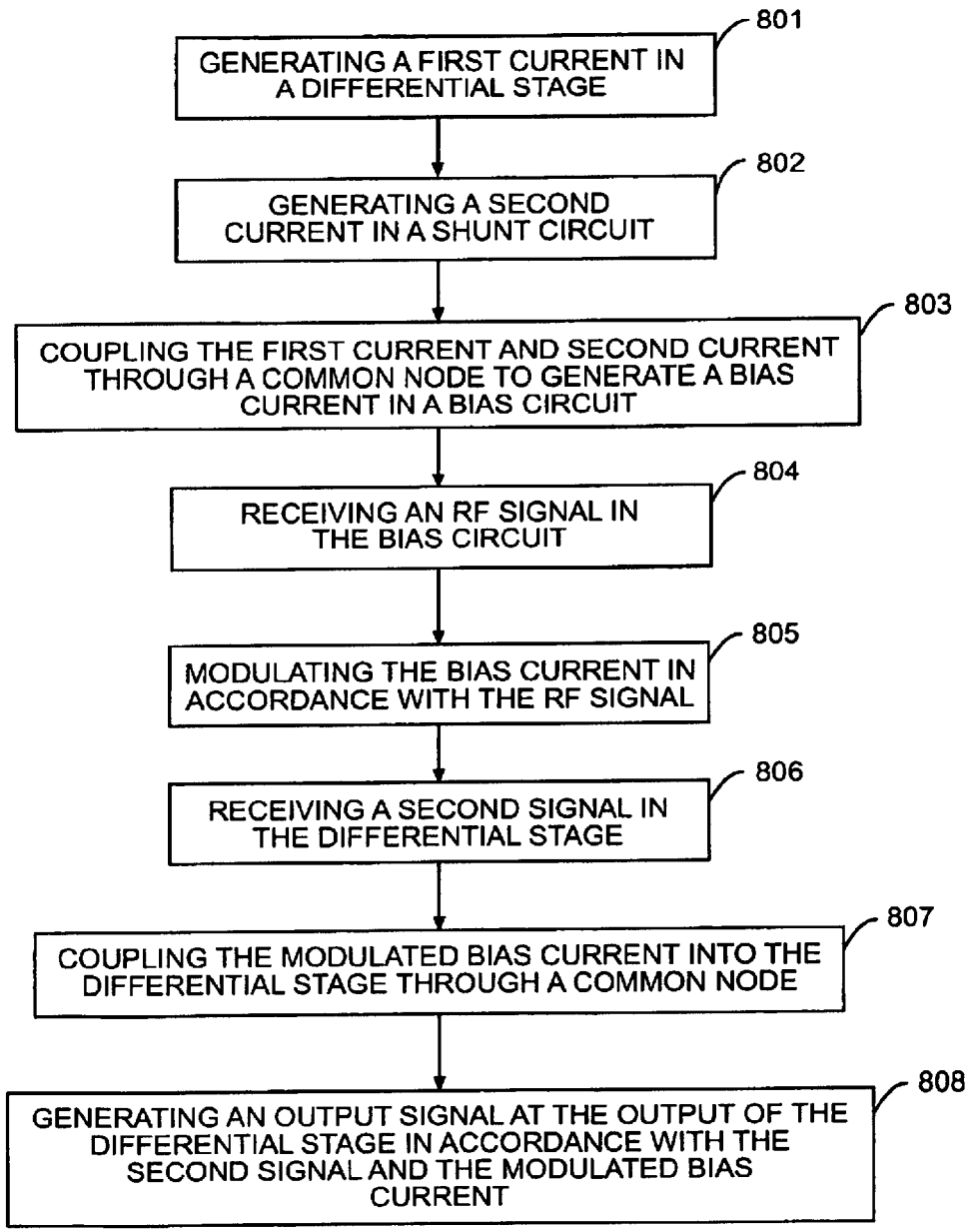
FIG. 8 shows a flow chart illustrating a method of mixing signals according to one embodiment of the present invention.

FIG. 8 shows a flow chart illustrating a method of mixing signals according to one embodiment of the present invention. According to the method illustrated in FIG. 8, a first current is generated in a differential stage at 801. Additionally, a second current is generated in a shunt circuit at 802. At 803 the first current and second current are coupled through a common node to generate a bias current in a bias circuit. At 804, an RF signal is received in the bias circuit. The RF signal modulates the bias current at 805. At 806, a second signal is received in the differential stage. The second signal may be generated by a local oscillator, for example. In one embodiment, the second signal is an integer fraction 1/N of the frequency of the RF signal (e.g. one-third) and includes a harmonic component at the frequency of the RF signal. The modulated bias current is coupled to the differential stage through a common node at 807. At 808, an output signal of the mixer circuit is generated at the output of the differential stage in accordance with the second signal and the modulated bias current.

Figure 9:
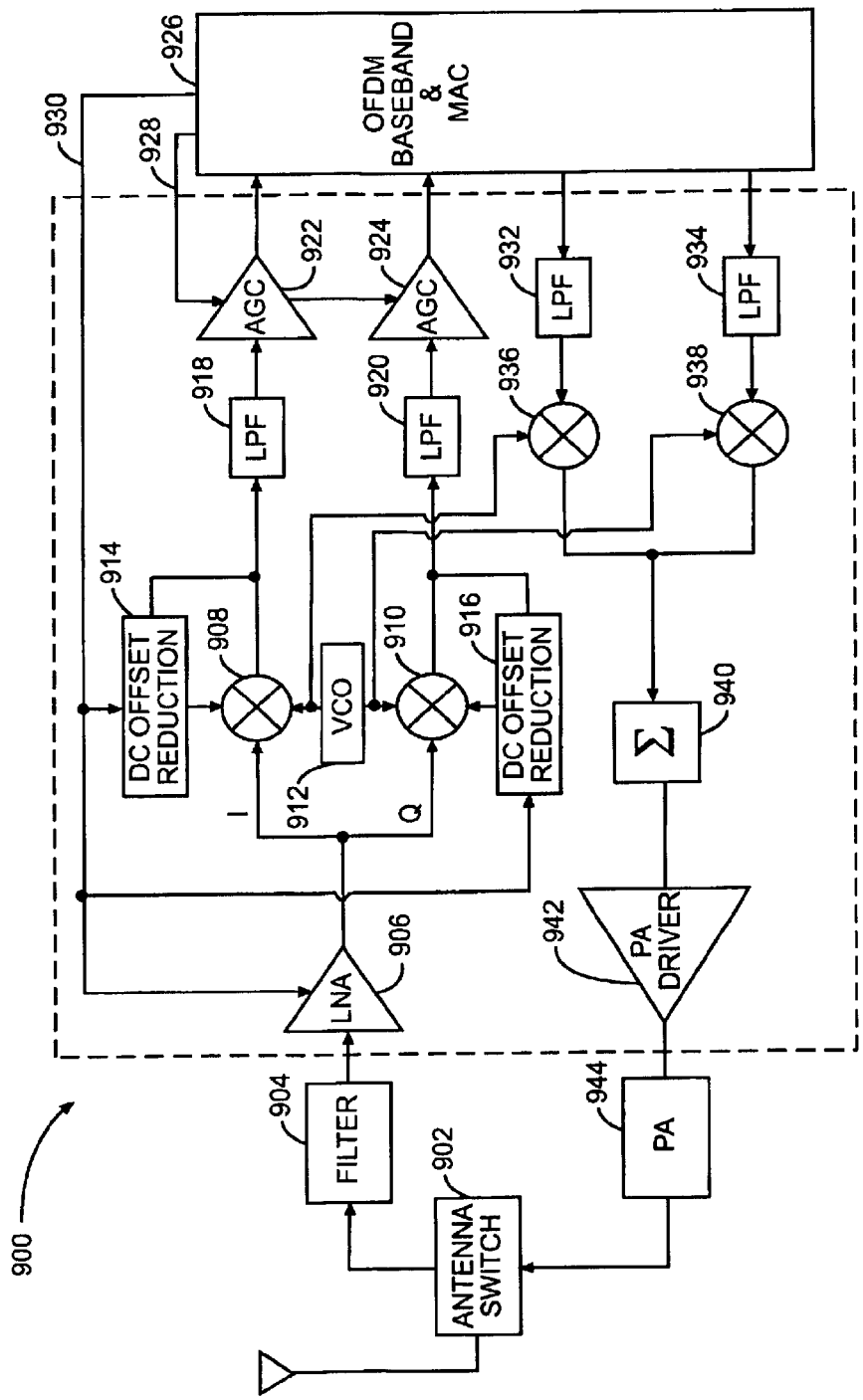
FIG. 9 is a block diagram of an RF transceiver with a low noise mixer circuit with improved gain in accordance with an embodiment of the present invention.

The mixer noise and gain techniques of the present invention are particularly well suited for highly noise sensitive high speed communication circuits. FIG. 9 is a block diagram of an RF transceiver 900 with a low noise mixer circuit with improved gain in accordance with an embodiment of the present invention. An antenna switch 902 operates to switchably connect the antenna to the receiver or the transmitter circuitry of transceiver 900. The receive channel includes a filter 904 that receives the signal from the antenna and operates to reject unwanted signals such as noise from adjacent channels. A low noise amplifier 906 amplifies the signal at the output of filter 904, and supplies it to in-phase (I) and quadrature-phase (Q) down-conversion mixers 908 and 910, respectively. Exemplary mixer structures and techniques that are particularly useful in an RF transceiver 900 are described in greater detail in commonly-assigned patent applications Ser. No. 09/691,297, titled "Mixer Noise Reduction Technique," Ser. No. 09/690,937, titled "Variable Gain Mixer Circuit," and Ser. No. 09/690,698, titled "Multi-Phase Mixer," all of which are hereby incorporated by reference. A voltage controlled oscillator (VCO) 912 generates a pair of local oscillating signals that are 90 degrees out-of-phase with respect to each other. The local oscillating signals are respectively supplied to the I and Q mixers. Dc offset reduction circuits 914 and 916 are coupled around mixers 908 and 910, respectively. One example of a preferred implementation for Dc offset correction circuits 908 and 910 is described in greater detail in commonly-assigned patent application Ser. No. 09/___,___ (Atty Docket No. 020798-001100US), titled "Method and Apparatus for Reducing DC Offset," which is hereby incorporated by reference. The I and Q signals are respectively filtered by low pass filters (LPFs) 918 and 920, and the filtered lower frequency signals are applied to automatic gain control (AGC) circuits 922 and 924, respectively. One example of a preferred implementation for LPFs 918 and 920 is described in greater detail in commonly-assigned patent application Ser. No. 09/612,116, titled "Active Circuit having LC Trap Functionality," which is hereby incorporated by reference. The baseband signal processing is performed by block 926 that receives outputs of AGCs 922 and 924 and converts the analog signals to digital signal before processing them using, for example, orthogonal frequency division multiplexing (OFDM). In this embodiment, block 926 also provides media access control (MAC) functionality. The gain adjustment control signals 928 and 930 are provided by block 926. Control signal 928 adjusts the gain of AGCs 922 and 924. Control signal 930 adjusts the gain of LNA 906, dc offset reduction circuits 914 and 916, and, in some embodiments, mixers 908 and 910. The receive channel includes low pass filters (LPFs) 932 and 934 that receive the I and Q signals and supply them to I and Q up-conversion mixers 936 and 938. In this embodiment, both transmit and receive signals are differential in nature. The outputs of the two up-conversion mixers are combined and applied to a differential to single-ended converter 940. One preferred embodiment of a differential to single-ended converter is described in greater detail in commonly-assigned patent application Ser. No. 09/___,___ (Atty Docket No. 020798-000800US) titled "Differential to Single-ended Converter with Large Output," which is hereby incorporated by reference. The single-ended output of converter 940 is supplied to a power amplifier driver 942 which drives the input of a power amplifier 944 before being supplied to switch 902. In a specific embodiment, this block diagram implements a 5 GHz RF transceiver according to the IEEE 802.11a standard.

Figure 10:
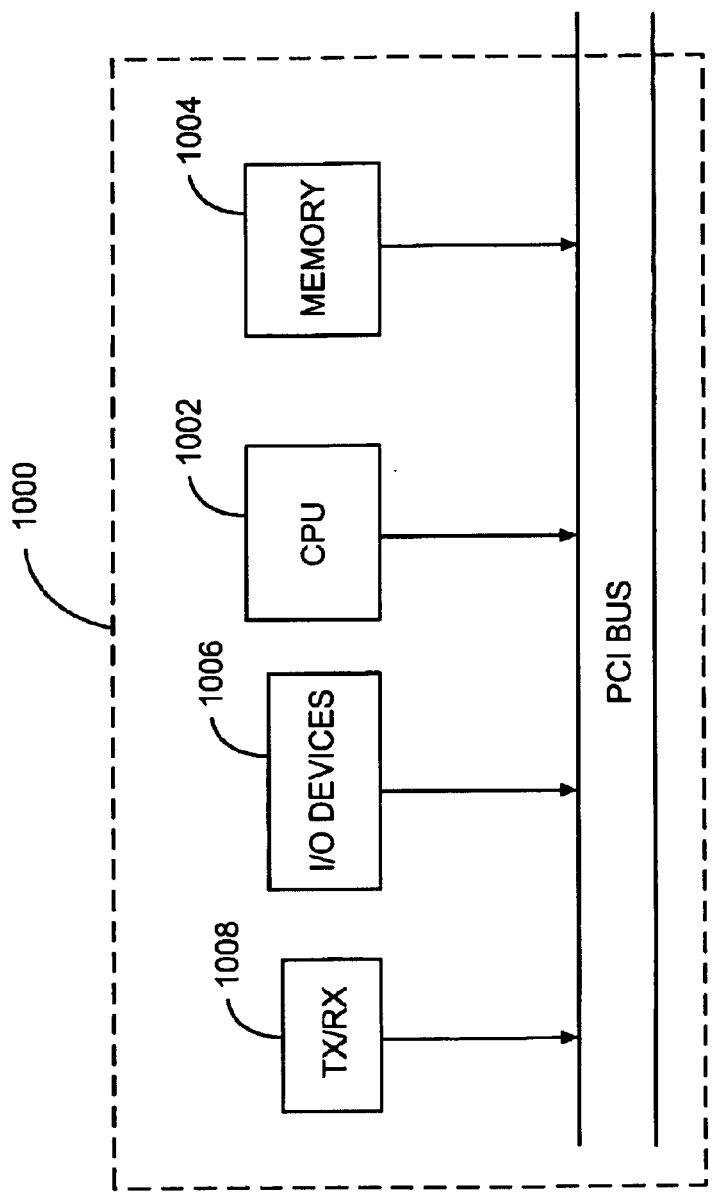
FIG. 10 shows a simplified block diagram for one example of an electronic system having optimized performance according to the present invention.

According to another embodiment of the present invention, the low noise mixer circuit with improved gain as embodied in the transceiver of FIG. 9 allows for implementation of various electronic systems that are capable of wireless RF communication with optimized performance. Such electronic systems include desktop and laptop personal computers, mobile telephone, television and internet devices, home gateways and media servers, portable digital music devices, data pipes and the like. FIG. 10 shows a simplified block diagram for one example of an electronic system having optimized performance according to the present invention. In this example, a desktop personal computer 1000 is used for illustrative purposes. System 1000 includes a central processing unit (CPU) 1002, memory 1004, input/output (I/O) devices 1006, and transceiver 1008 all coupled to a common personal computer interface (PCI) bus 1010. Tranceiver 1008 may be incorporated into and couple to PCI bus 1010 via I/O devices block 1006. Transceiver 1008 is of the type described above in connection with FIG. 9. Via PCI bus 1010 transceiver 1008 allows system 1000 to wirelessly communicate with other RF wireless devices.

It is to be understood that a person skilled in the art, in light of the detailed description above, would understand that the particular portions of bias current shunted using the frequency dependent shunt circuit can be adjusted to meet the particular requirements of a design while gaining the advantages of the present invention. For example, in one embodiment, the second portion of bias current frequency components shunted at higher frequencies is substantially zero.

Moreover, a person skilled in the art would also understand how to manipulate the embodiments presented above to modify the first and second frequency ranges to meet the requirements of a particular design. For example, in one embodiment the mixer circuit is used as a demodulator. Accordingly, the first input signal frequency may be 5 GHz. Additionally, the second input signal frequency may be a 5 GHz carrier with a 1 MHz sideband. Accordingly, one skilled in the art could design first and second frequency ranges of the frequency dependent shunt circuit to pass the 1 MHz signal to the output.

Having fully described alternative embodiments of the present invention, other equivalent or alternative techniques for reducing noise in a mixer circuit according to the present invention will be apparent to those skilled in the art. For example, while the present invention was primarily described in connection with a NMOS differential amplifier, the present invention can be used for other amplifier structures which receive a signal to be modulated on a common node that sets the bias of the gain stage of the mixer. Additionally, other devices such as PMOS, bipolar, gallium arsenide, or combinations thereof may be used in equivalent structures without departing from the spirit and scope of the present invention. These equivalents and alternatives along with the understood obvious changes and modifications are intended to be included within the scope of the present invention as defined by the following claims.

What is claimed is:

1. A mixer circuit comprising:
    a gain stage coupled to receive a first signal on a first input and a modulated bias current on a common node, and in accordance therewith, produce an output signal, the gain stage having a first current;
    a current shunt circuit coupled between the common node and a reference voltage, the current shunt circuit providing a second current from the reference voltage to the common node, wherein the first current and the second current are coupled to the common node; and
    a bias circuit to generate the modulated bias current, the bias circuit having an input coupled to receive a second signal, and in accordance therewith, generate the modulated bias current, and an output coupled to the common node to provide the modulated bias current to the gain stage.

2. The mixer circuit of claim 1 wherein the second current controls the gain of the gain stage and bias circuit.

3. The mixer circuit of claim 1 wherein the current shunt circuit comprises a MOS transistor having a gate terminal, a source terminal, and a drain terminal, one of the source terminal and the drain terminal coupled to the common node and the other of the source terminal and the drain terminal coupled to the reference voltage.

4. The mixer circuit of claim 3 wherein the reference voltage is a supply voltage.

5. The mixer circuit of claim 3 wherein current shunt circuit further comprises a resistor coupled in series between the common node and the MOS transistor.

6. The mixer circuit of claim 1 wherein the second signal is an RF signal and the first signal is a differential signal.

7. The mixer circuit of claim 6 wherein the frequency of the differential signal is an integer fraction of the frequency of the RF signal.

8. The mixer circuit of claim 7 wherein the integer fraction is one-third.

9. The mixer circuit of claim 6 wherein the differential signal is approximately a square wave.

10. The mixer circuit of claim 6 wherein the differential signal is generated by a local oscillator, and wherein to output of the local oscillator is amplified to generate a differential signal that approximates a square wave.

11. The mixer circuit of claim 1 wherein the bias circuit comprises a first transistor having a control input and a first and second output, wherein the control input is coupled to receive an RF signal, the first output is coupled to a second reference voltage, and the second output is coupled to the common node.

12. The mixer circuit of claim 11 wherein the first transistor is an NMOS transistor.

13. The mixer circuit of claim 11 wherein the bias circuit further comprises a capacitor having a first terminal coupled to the gate of The first transistor and a second terminal coupled to receive the RF input signal.

14. The mixer circuit of claim 1 wherein the gain stage is a differential stage and the first signal is a differential signal.

15. The mixer circuit of claim 14 wherein the differential stage comprises:

a first transistor having a control input and first and second outputs, the control input coupled to receive a first component of the differential signal;

a second transistor having a control input and first and second outputs, the control input coupled to receive a second component of the differential signal; and a load coupled to the first output of the first transistor and to the first output of the second transistor, wherein the second output of the first transistor and the second output of the second transistor are coupled together and to the common node.

16. The mixer circuit of claim 15 wherein the first and second transistors are NMOS transistors.

17. The mixer circuit of claim 15 wherein the load comprises a first resistor coupled between the first output of the first transistor and a supply voltage and a second resistor coupled between the first output of the second transistor and the supply voltage.

18. The mixer circuit of claim 1 wherein the reference voltage is a supply voltage.

19. A method of mixing signals in a mixer circuit comprising:

generating a first current in a differential stage;

generating a second current in a shunt circuit coupled between the common node and a reference voltage, the second current provided from the reference voltage to the common node;

coupling the first current and the second current through a common node to generate a bias current in a bias circuit;

receiving an RF signal in the bias circuit;

receiving a second signal in the differential stage; and generating a mixer output in accordance with the RF signal and the second signal.

20. The method of claim 19 further comprising modulating the bias current in accordance with the RF signal.

21. The method of claim 19 further comprising coupling the modulated bias current into the differential stage through the common node.

22. The method of claim 19 wherein the frequency of the second signal is an integer fraction of the frequency of the RF signal.

23. The method of claim 22 wherein the integer fraction is one-third.

24. The method of claim 19 wherein the mixer output is proportional to the product of the first signal and the second signal.

* * * * *